(12) United States Patent
Hsu

(10) Patent No.: US 6,251,732 B1
(45) Date of Patent: *Jun. 26, 2001

(54) METHOD AND APPARATUS FOR FORMING SELF-ALIGNED CODE STRUCTURES FOR SEMI CONDUCTOR DEVICES

(75) Inventor: James Hsu, Saratoga, CA (US)

(73) Assignee: Macronix International Co., Ltd., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/371,255

(22) Filed: Aug. 10, 1999

(51) Int. Cl.$^7$ ................................................ H01L 21/8236
(52) U.S. Cl. .................... 438/276; 438/275; 438/278; 257/390; 257/391; 257/392
(58) Field of Search .................... 438/275, 276, 438/278; 257/390–392

(56) References Cited

U.S. PATENT DOCUMENTS

| 5,117,389 | | 5/1992 | Yiu | 365/104 |
| 5,376,573 | * | 12/1994 | Richart et al. | 437/48 |
| 5,609,746 | * | 3/1997 | Farrar et al. | 205/125 |
| 5,620,131 | * | 4/1997 | Kane et al. | 228/215 |
| 5,656,519 | * | 8/1997 | Mogami | 438/303 |
| 5,691,216 | * | 11/1997 | Yen et al. | 437/45 |
| B1 6,180,463 | * | 1/2001 | Otsuki | 438/278 |

* cited by examiner

Primary Examiner—Charles Bowers
Assistant Examiner—Erik Kielin
(74) Attorney, Agent, or Firm—Beyer Weaver & Thomas, LLP (57) ABSTRACT

Improved methods for forming integrated circuit devices with alignment structures such as a read-only memory (ROM) array in preparation for code programming with a mask is disclosed. In one embodiment, a gate oxide layer is deposited over a substrate and a gate stack layer is formed over the gate oxide layer. The gate stack layer includes a conductive layer and a sacrificial gate layer formed above the conductive layer with a thin layer of etch stop material in between. The gate stack layer is patterned and etched to form a plurality of wordlines having openings therebetween. An ion barrier layer is deposited over the patterned gate stacks, filling the openings. The ion barrier layer is then etched back to form alignment structures in the openings. A code programming mask, is deposited over the resulting structure and patterned to expose portions of the sacrificial gates. The exposed portions of the plurality of sacrificial gates are removed, followed by ion implantation in the designated channel regions.

12 Claims, 6 Drawing Sheets

METHOD AND APPARATUS FOR FORMING SELF-ALIGNED CODE STRUCTURES FOR SEMI CONDUCTOR DEVICES

BACKGROUND OF THE INVENTION

The present invention relates generally to the alignment and positioning of mall features during fabrication of integrated circuit devices, including the alignment of code programming features in non-volatile memory devices.

Alignment and selectivity are important factors that affect production yields during the processes used in the manufacture of integrated devices having relatively small dimensions. By way of example, a number of integrated circuit based non-volatile memory devices require ion implantation to program selected code into selected memory cells during fabrication. One type of non-volatile memory device is a mask-programming read-only-memory (ROM) device. A mask programmable ROM is a non-volatile memory device that retains data even if power is removed from the device. One example of a ROM implementation using flat cell design is disclosed in U.S. Pat. No. 5,117,389 entitled "Flat-Cell Read-Only-Memory Integrated Circuit" by Yiu, which is incorporated by reference.

One typical ROM array architecture utilizes a plurality of metal-oxide-semiconductor (MOS) transistors, or memory cells, that are arranged in an array. The cells in the array are coupled using bitlines and wordlines. If a voltage applied to the gate of a particular memory cell is lower than a threshold voltage, the memory cell is not turned on (i.e. electric current will not flow between the source and the drain). On the other hand, if the voltage applied to the gate of the memory cell is higher then the threshold, the memory cell is turned on. Accordingly, the cell can be programmed by implanting selected memory cells in order to define the threshold voltage of the cell. For smaller integrated circuit devices, errors may occur in the ion implantation step due to variations in the critical dimensions of the code programming mask as well as possible misalignment of the mask.

Figure 1:
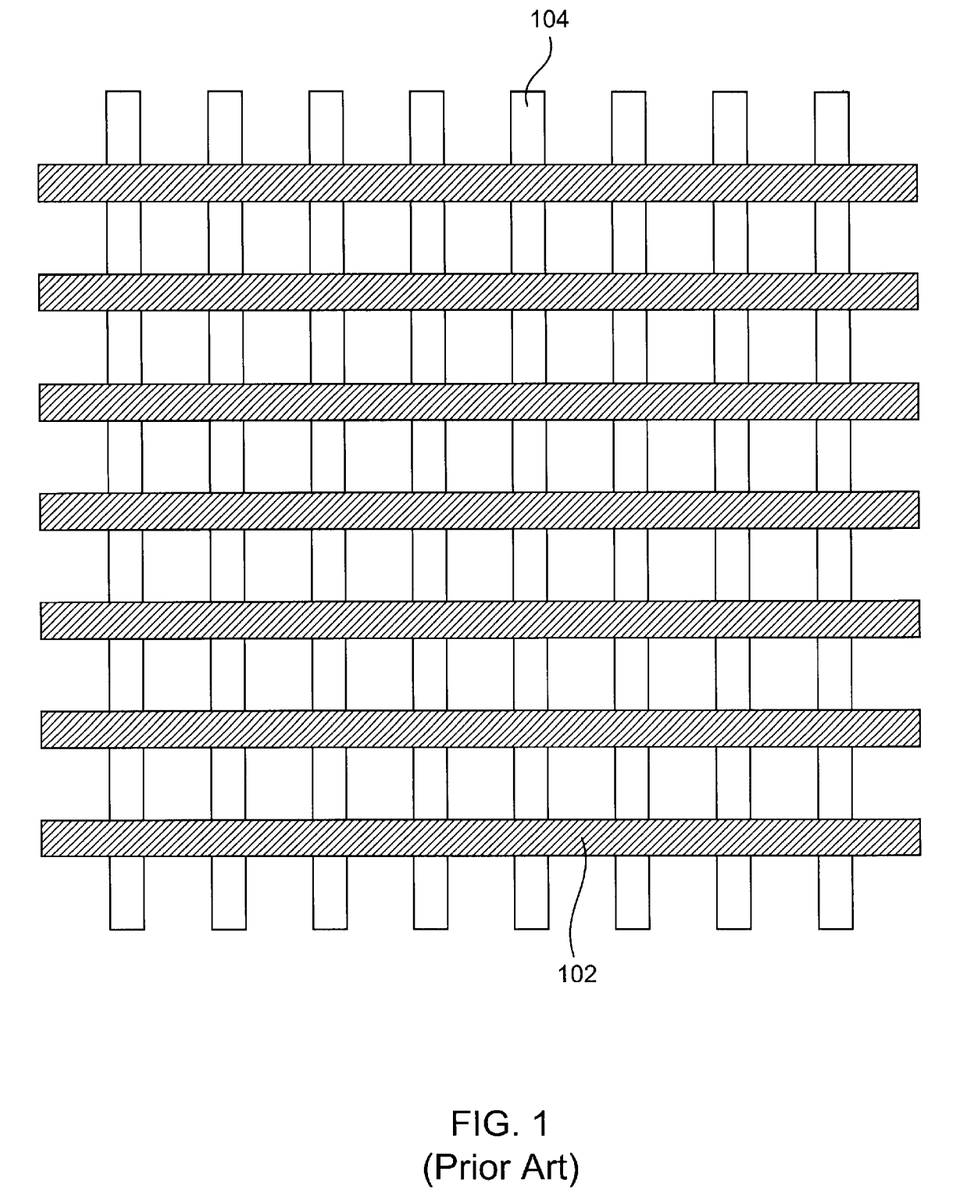
FIG. 1 is a top view of a ROM array showing a plurality of orthogonally arranged bitlines and wordlines.
Figure 2:
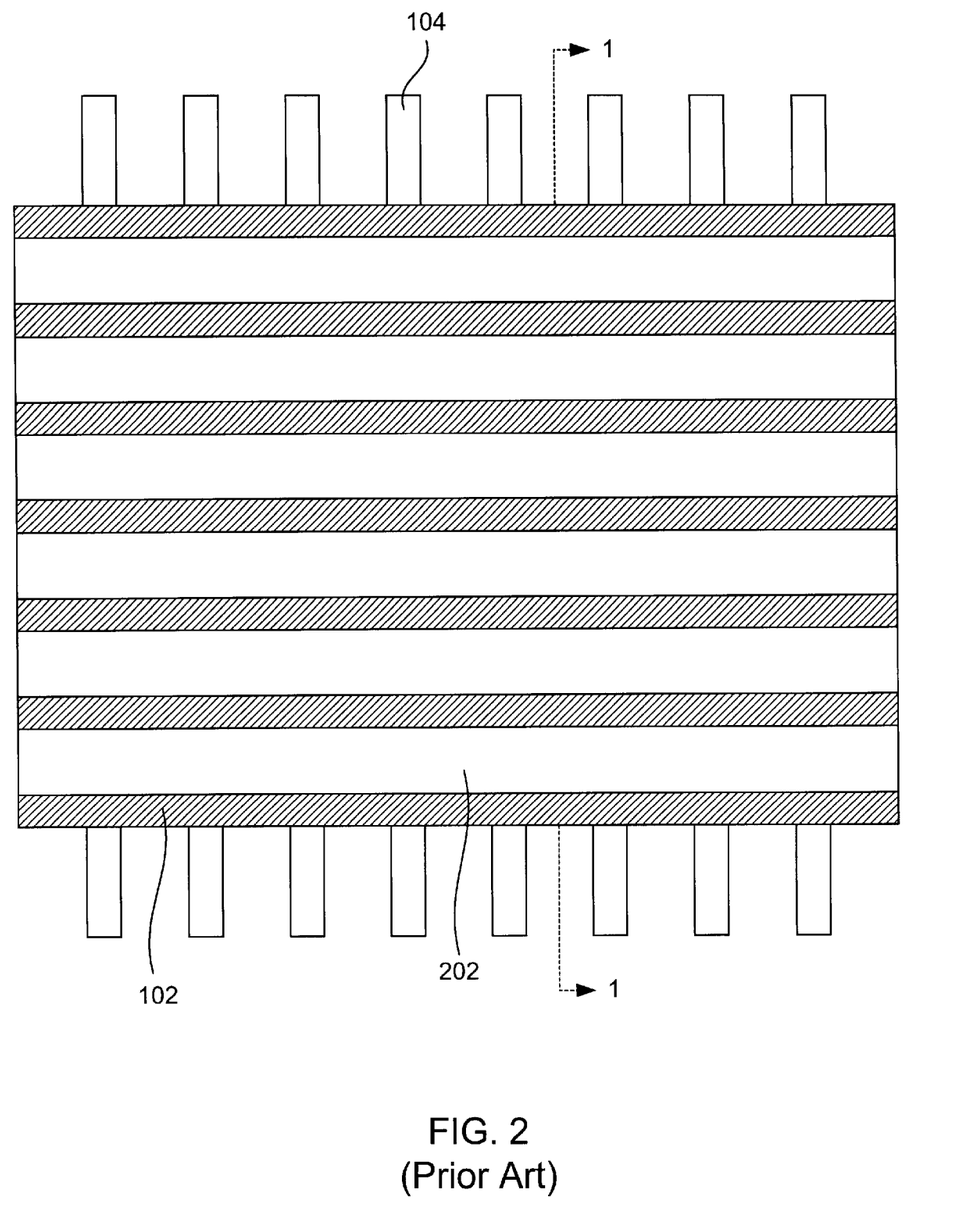
FIG. 2 is a top view of a mask ROM array showing the alignment structures that are formed orthogonally to the plurality of bitlines and parallel to the plurality of 0 wordlines.

An improved process for fabricating a flat cell mask programmable ROM device that utilizes alignment structures to reduce the risk of errors due to mask misalignment is described in the U.S. Pat. No. 5,691,216 entitled "Integrated Circuit Self-Aligning Process and Apparatus" by Yen et al., which is incorporated by reference. As described therein, alignment structures may offer certain advantages in improving alignment and selectivity. Referring initially to FIGS. 1 and 2, a flat cell mask programmable ROM device that is ready for code programming via ion implantation in accordance with the process described in the '216 patent will be briefly described. As best seen in FIG. 1, a ROM array is provided that has a plurality of wordlines 102 that are arranged orthogonally relative to a plurality of bitlines 104. The wordlines 102 are isolated by ion barriers 202 that, as best seen in the cross sectional view of FIG. 2, usually have heights that are greater then the heights of the wordlines 102. The ion barriers 202 effectively act as alignment structures that compensate for misalignments in the masking layer used during code programming of the mask ROM array. The ion barriers also help provide uniform channel widths along similar coded regions and provide additional contact and support surface area for the code programming mask.

Figure 3:
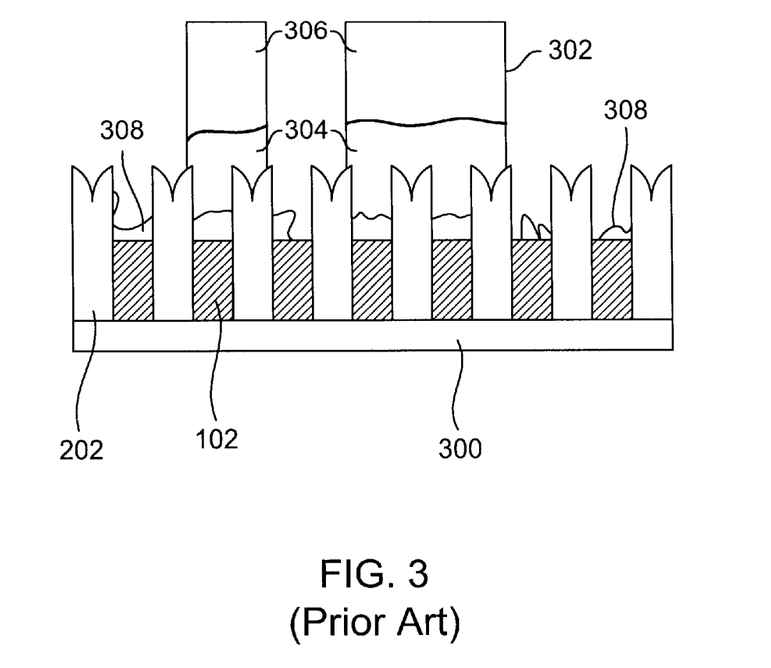
FIG. 3 is a side cross-sectional view of the mask ROM array of FIG. 2 along the imaginary line X–X' of FIG. 2, illustrating the residue problem.

FIG. 3 illustrates a side cross-sectional view of the mask ROM array of FIG. 1 after the code programming mask 302 has been deposited and portions of it removed in preparation for code programming. The ion barriers 202 and the wordlines 102 are positioned over a gate oxide layer 300. The ion barriers are typically made of silicon nitride or silicon dioxide and are positioned between the plurality of wordlines. Since the ion barriers have a height that is greater than the height of the wordlines, an uneven tooth-like topography results. Although this described structure works well, the tooth-like topography sometimes makes it difficult to remove the unwanted portions of the code programming mask 302 in preparation for ion implantation.

More specifically, the code programming mask 302, may typically include, a bottom anti-reflective coating (BARC) layer 304 underlying a photoresist layer 306. BARC layer 304 is placed over the uneven surface defined by the top surfaces of wordlines 102 and alignment structures 202. Photoresist layer 306 is then deposited over BARC layer 304. When the portions of code programming mask 302 is removed to expose some designated portions of the wordlines for code programming, some BARC material, or in the worst cases, photoresist, may be left behind in the trenches 308 that are defined by the top surfaces of the wordlines and part of the side walls of the alignment structures where the height of the alignment structures surpass those of the wordlines. The BARC material and/or photoresist residue left behind on the wordline surfaces may block the ion implants, which in turn may result in errors in the code programming process.

In view of the foregoing, improved methods and apparatuses for forming integrated circuit devices with alignment structures that promote self-alignment during ion implantation would be desirable.

SUMMARY OF THE INVENTION

To achieve the foregoing and other objects and according to the purpose of the present invention, improved methods for forming integrated circuit devices with alignment structures are disclosed. In one embodiment of the invention, a method of forming an integrated circuit device such as a read-only memory (ROM) array in preparation for code programming with a mask is disclosed. In one embodiment, a gate oxide layer is deposited over a substrate and a gate stack layer is formed over the gate oxide layer. The gate stack layer includes a conductive layer and a sacrificial gate layer formed above the conductive layer. The gate stack layer is patterned and etched to form a plurality of wordlines having openings therebetween. An ion barrier layer is deposited over the patterned gate stacks, filling the openings. The ion barrier layer is then etched back to form alignment structures in the openings. A code programming mask, is deposited over the resulting structure and patterned to expose portions of the sacrificial gates. The exposed portions of the plurality of sacrificial gates are removed, followed by ion implantation in the designated channel regions.

In a preferred embodiment, the ion barrier layer is planarized to a level of the gate stacks, forming alignment structures and gate stacks of substantially the same height so that the alignment structures and the sacrificial gates may cooperate to form a substantially planar top surface in preparation for deposition of the code programming mask.

These and other aspects and advantages of the present invention will become apparent upon reading the following detailed descriptions and studying the various drawings.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

FIGS. 4–10 show a partial sequence of fabrication steps according to an embodiment of the present invention. Specifically.

DETAILED DESCRIPTION OF THE PREFERRED EMBODIMENTS

In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

The present invention relates generally to improvements to the processes described in U.S. Pat. No. 5,691,216. The described processes utilize ion barrier type alignment structures between adjacent word lines in a cell array to reduce the risk of errors due to mask misalignment. Sacrificial gate structures are formed over the word lines prior to application of a mask such as a code programming mask. The sacrificial gate structures are arranged to reduce the height differential between the word lines and the ion barrier type alignment structures in order to better facilitate complete removal of designated portions of the mask prior to an ion implantation step. In the code programming example, the alignment structures improve self-alignment during code programming while avoiding the problem of having ion implants blocked by mask residue that has been trapped in the corners of the trench-like structures defined by the wordlines in conjunction with their adjacent ion barrier type alignment structures.

For those who are unfamiliar with code programming of ROM arrays, the above-referenced patents which are incorporated herein by reference provide detailed descriptions of the general concept. Briefly, as described in the '216 patent, each MOS device or memory cell can be turned on (i.e., allow electrical current to conduct between the source and the drain) by applying a voltage to its gate that is higher than its threshold voltage. If the applied voltage is lower than the threshold voltage, the MOS device is not turned on, i.e., a logic 0 is stored in the memory cell. On the other hand, if the applied voltage is higher than the threshold voltage, a logic 1 is stored in the memory cell and the device is turned on. To provide the higher threshold voltage levels, code is programmed into certain areas of the ROMs during the manufacturing process using various code programming techniques such as mask programmning. Mask programming refers to the process wherein a mask is used to cover the memory cells where ion implantation is not desired. In the unmasked areas, ions are implanted into the channel regions, which raise the threshold voltage levels of those memory cells.

Figure 4:
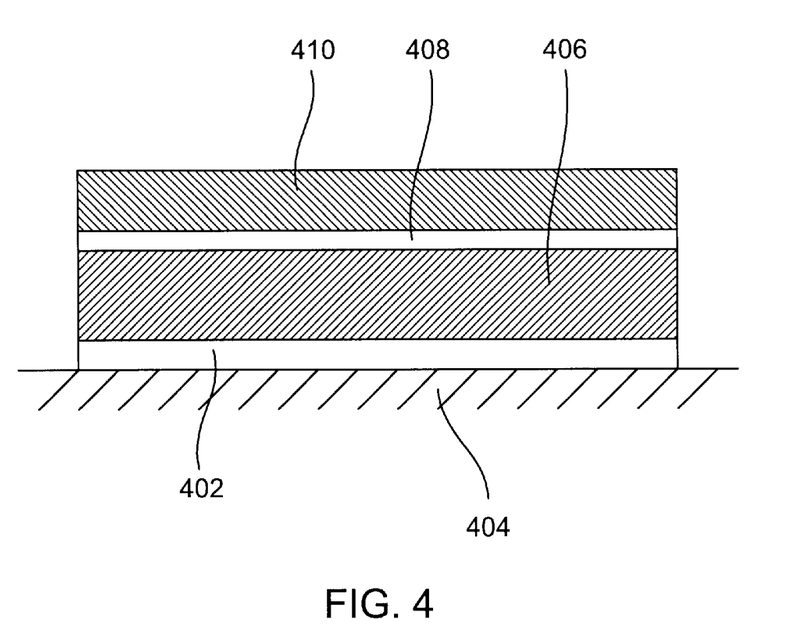
FIG. 4 shows the gate stack layer formed of a gate oxide layer, a wordline layer, an etch stop layer, and a sacrificial gate layer.

Referring to FIG. 4, a gate oxide layer 402 is deposited over a flat cell ROM array wafer substrate 404 having bit lines formed therein. After the gate oxide layer 402 has been applied, conductive layer 406 is deposited over the gate oxide layer. A variety of conductive materials may be used to form the conductive layer 406 and by way of example, polysilicon works well. As will be described in more detail below, the conductive layer 406 is eventually patterned and etched to form a series of wordlines. The thickness of the conductive layer 406 will depend in large part upon the desired cell size and characteristics. By way of example, thicknesses in the range of about 3000 Å to 3500 Å work well in integrated circuit devices of sub-micron dimensions. It should be noted that the dimensions described herein are generally dimensions suitable for use in present state-of-the-art devices. However, it should be appreciated that the invention is not limited to these ranges and that it is generally expected that the appropriate dimensions for various device features will evolve over time as device sizes are reduced and will generally vary with the nature of the particular devices being formed.

After the conductive layer 406 has been applied, an etch stop layer 408 is then deposited over conductive layer 406, followed by deposition of a sacrificial gate layer 410. The etch stop layer is optional in the described process and its purpose is to serve as an etch stop during removal of the sacrificial gate from cells that are to be ion implanted for code programming. The advantage of using the etch stop layer is that it tends to leave a more even surface in preparation for code programming. In the embodiment shown, etch stop layer 408 is designed to be a relatively thin layer so that its presence does not block ion implant. With this arrangement, it is not necessary to remove the etch stop layer prior to code programming. The etch stop layer may be formed by any suitable process, as for example chemical vapor deposition of an oxide material such as silicon dioxide. The thickness of the etch stop layer 408 may be varied in accordance with the needs of a particular application. By way of example, thicknesses on the order of about 300 Å have been found to work well when silicon dioxide is used.

Sacrificial gate layer 410 preferably formed from a dry etch removable material such as polysilicon so that the resulting sacrificial gates that overlies channel regions selected for code programming may easily be removed in their entirety without damage to an underlying layer, e.g., a wordline. In the described embodiment, sacrificial gate layer 410 has a thickness of between about 3000 Å and about 3500 Å, although as mentioned earlier for other layers, these dimensions may change with decreases in device sizes or other variable factors. It should also be noted that other additional layers may be above or below any of the layers described in this discussion. Consequently, as the term is used herein, relative positional terms such as over or above do not necessarily indicate a direct contact between the layers under discussion. Further, not all of the shown layers need necessarily be present and some or all may be substituted by other different layers.

Figure 5:
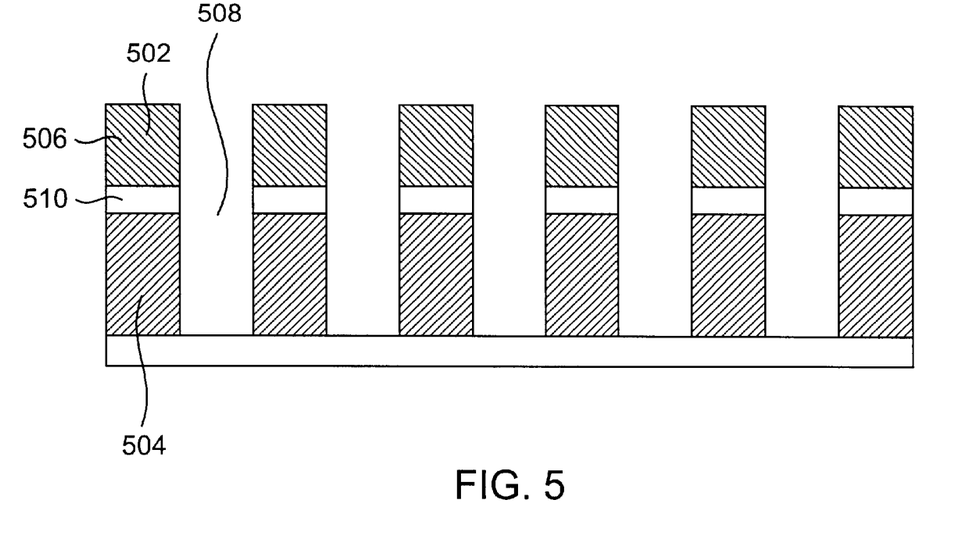
FIG. 5 shows a row of gate stacks that are formed by patterning and etching the gate stack layer.

After formation of the described wordline, etch stop and sacrificial gate layer stack, a series of gate stacks are created based on a wordline pattern by etching through wordline layer 406, etch stop layer 408 and sacrificial gate layer 410, leaving gate oxide layer 402 intact. The patterning and etching to form the series of gate stacks is done using conventional methods, and therefore, will not be described in detail for purposes of simplifying the discussion. FIG. 5 illustrates a row of gate stacks 502 that are formed by patterning and etching the gate stack layer. As shown in the figure, an exemplar gate stack 502 is composed of a wordline 504 underlying a sacrificial gate 506, and is separated from an adjacent gate stack by an opening 508. An optional etch stop layer segment 510 may also be included in gate stack 502 as shown in FIG. 5 between wordline 504 and sacrificial gate 506. Each etch stop segment is formed from the etch stop layer 408 during the forming of the gate stacks as described earlier and may serve as an etch stop if the underlying sacrificial gate is to be removed.

The use of sacrificial gates 506 allows for selected portions of the code programming mask to be completely removed without concerns of possible damage to a layer or layers underlying the code programming mask. Since the sacrificial gates that have been exposed by removing portions of the code programming mask will eventually be completely removed, the condition of these exposed sacrificial gates upon mask removal is immaterial. The only requirements are that no residue from the code programming mask should remain on the wordlines so as to avoid blocking the ion implantation and that care be taken so that the wordlines will remain undamaged upon removal of the sacrificial gates. These requirements are met by use of sacrificial gates which can be etched away from the top surface and are made of a material that can be completely removed by some technique such as dry etching without damage to the underlying layer.

Figure 6:
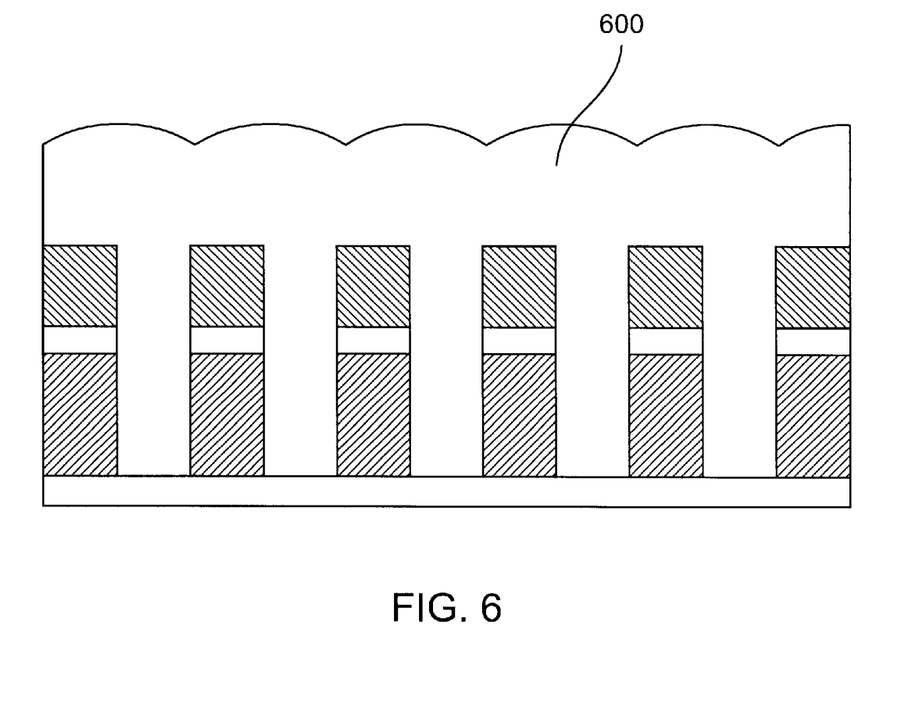
FIG. 6 shows an oxide layer deposited over the row of gate stacks in FIG. 5.
Figure 7:
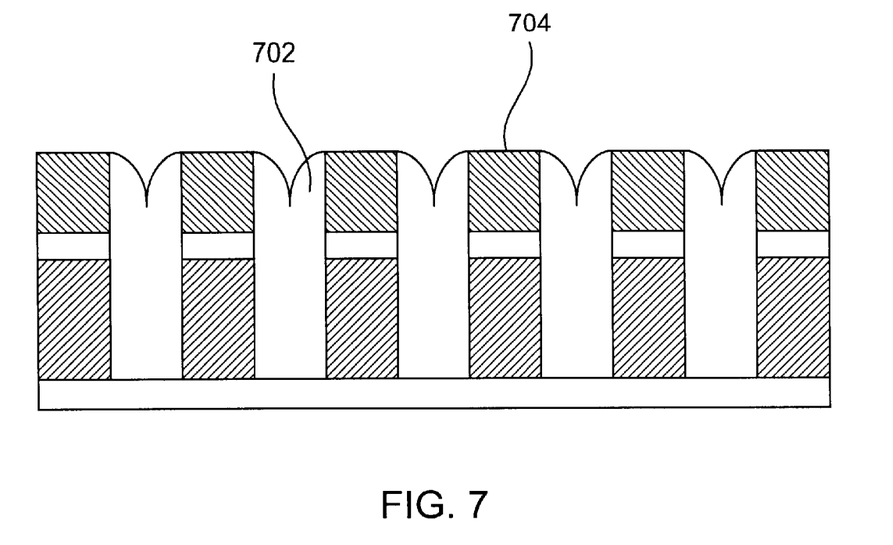
FIG. 7 shows the structure of FIG. 6 after the top portion of the oxide layer has been etched away to about a level of the gate stacks to form a row of alignment structures.

As illustrated in FIG. 6, an ion barrier layer 600 is deposited over the row of gate stacks of FIG. 5 and filling the openings. Ion barrier layer 600 may be formed from silicon nitride or silicon dioxide, and may be deposited by chemical vapor deposition (CVD). Referring to FIG. 7, the top portion of ion barrier layer 600 is then etched back to form a series of alignment structures 702. In a preferred embodiment, ion barrier layer 600 is etched back to a height substantially equivalent to about a level of the gate stacks, which results in gate stacks and alignment structures of substantially the same height, preferably about 7000 Å. Consequently, the upper surfaces of these gate stacks and alignment structures cooperate to form a substantially planar top surface 704, thus essentially eliminating the trench-like structures formed using earlier methods that posed the problems of retaining unwanted mask residue after removing selected portions of the code programming mask.

Figure 8:
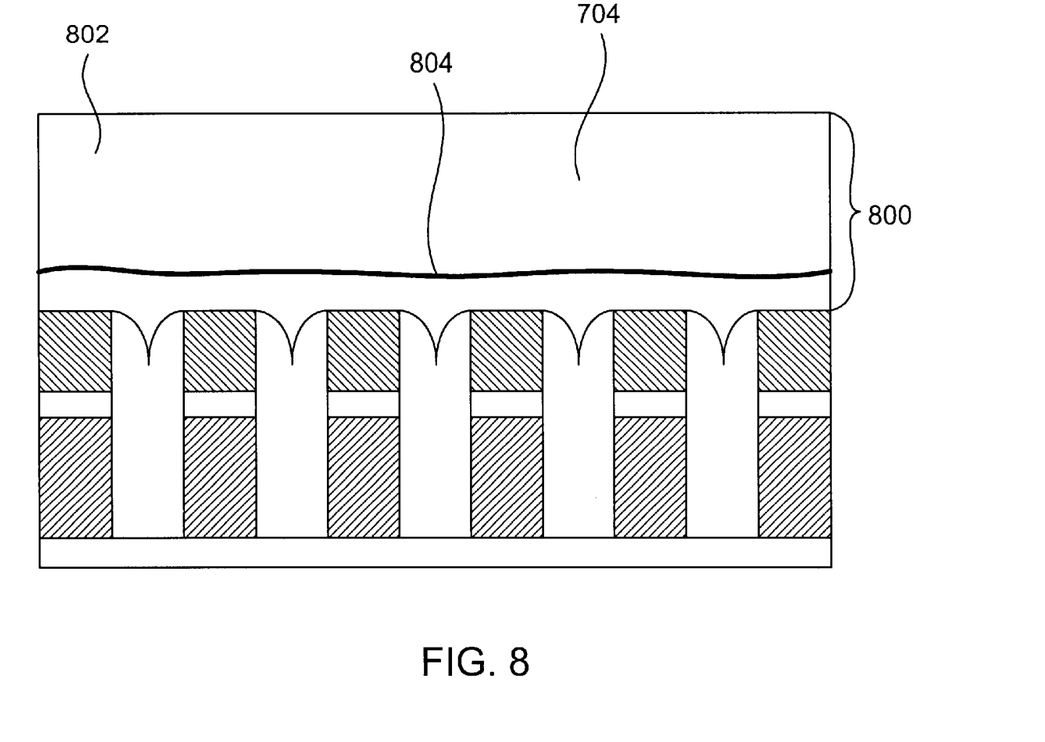
FIG. 8 shows the structure of FIG. 7 after a code programming mask composed of photoresist and BARC has been deposited on the top layer defined by the alignment structures and the gate stacks.
Figure 9:
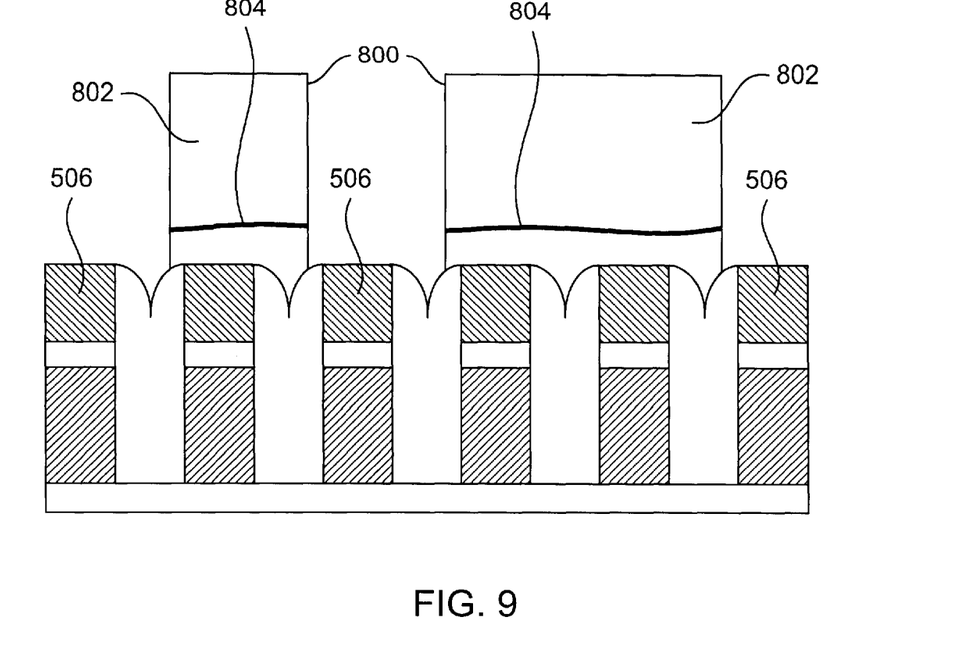
FIG. 9 shows the structure of FIG. 8 after the code programming mask has been patterned and portions of it removed to expose the underlying sacrificial gates.

Then, as illustrated in FIG. 8, a code programming mask 800, which in this example is composed of a photoresist layer 802 and a bottom anti-reflective coating (BARC) 804, is deposited over top surface 704. Code programming mask 800 is then patterned and etched as shown in FIG. 9 to expose the underlying sacrificial gates 902. Exposed sacrificial gates 902 may also be partially etched away during the patterning and etching of code programming mask 800 to ensure no mask residue is left to block the ion implants, though this becomes a negligible issue in the preferred embodiment, wherein the substantially planar surface over which the code programming mask is deposited virtually eliminates the trench-like structures, which in turn, eradicates the problem of having mask residue trapped in the corners of these trench-like structures and blocking code implants.

Figure 10:
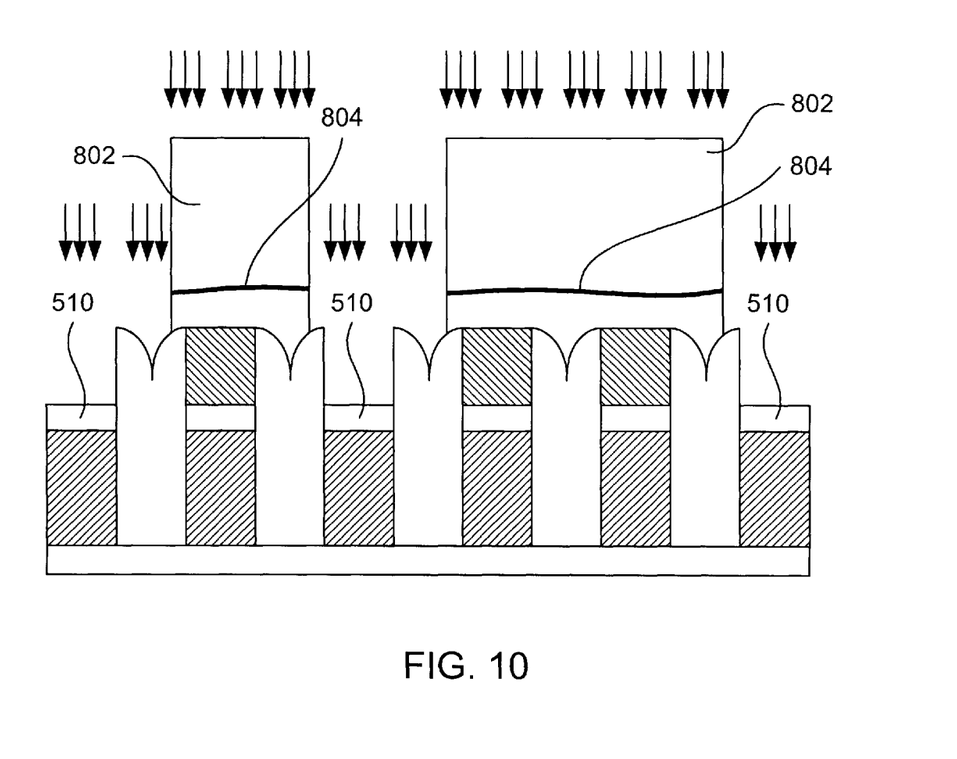
FIG. 10 shows the structure of FIG. 9 after the exposed sacrificial gates are removed in preparation for code programming using ion implantation.

In a subsequent step, sacrificial gates 902 are removed by a dry etch process, followed by implantation of ions such as p-type boron ions into the wordlines formerly underlying the removed sacrificial gates as illustrated in FIG. 10. As mentioned previously, optional etch stop layer segments 1002 are thin enough so that they do not affect the implantation of ions into the channel regions and need not be removed prior to the code programming process.

After ion implantation, the remainder of code programming mask 800 may be removed. Subsequent steps may include the deposition of additional dielectric or conductive layers over the code programmed structure as well as the forming of vias through these layers to allow electrical contact between an underlying metal contact such as a wordline and, for example, a conductive layer.

These methods of forming an integrated circuit device such as a read-only memory (ROM) array in preparation for code programming have many inherent advantages which solves the problems encountered with earlier methods related to incomplete removal of mask residue. The method that is the subject of this invention provides a structure having sacrificial gates that serve as protective barriers to ensure complete removal of designated portions of the code programming mask without damage to the wordlines. A preferred embodiment of the invention provides a planar profile for deposition of the code programming mask. This eliminates the problems that were present with earlier methods of forming integrated circuit devices that called for depositing a code programming mask over an uneven surface having trenches. This posed a high likelihood of trapping bottom anti-reflective coating (BARC) and/or photoresist residues within the trenches when portions of the code programming mask were being removed in preparation for the ion implantation. Resolving the residue problem avoids the possibility of the ion implants being blocked by the residues, which in turn minimizes the errors in the code programming process.

While this invention has been described in terms of several preferred embodiments, there are alterations, permutations, and equivalents which fall within the scope of this invention. For example, as the size of integrated circuit devices is being scaled down, the structures used in the manufacture of these integrated circuit devices will be scaled down accordingly. Therefore, the dimensions of the structures used in this method are not limited to those given as examples in the description. It should also be noted that there are many alternative ways of implementing the methods and apparatuses of the present invention. For example, although one specific implementation of forming the self-aligned code structure has been characterized in the description and the corresponding figures, it is understood by those skilled in the art that there may be alternative ways of implementing the method that is the subject of this invention to arrive at the desired self-aligned code structure. Moreover, although the description characterizes the sacrificial gates as materials made of a dry etch removable material, it should be understood by those skilled in the art that the sacrificial gates may be formed from any alternative material that can be easily removed by other techniques without damage to the underlying wordlines. It is therefore intended that the following appended claims be interpreted as including all such alterations, permutations, and equivalents as fall within the true spirit and scope of the present invention.

What is claimed is:

1. A method of forming an integrated circuit device in preparation for code programming with a mask, the method comprising:

provqding a substrate having a plurality of bitlines;

forming a gate oxide layer over the substrate;

forming a conductive layer over the gate oxide layer;

forming a plurality of spaced apart gate stacks having openings therebetween, each of the plurality of gate stacks having a sacrificial gate portion and a wordline;

forming a plurality of alignment structures, each of the plurality of alignment structures being positioned in an associated one of the openings, the alignment structures and the gate stacks defining a top surface;

forming a code programming mask over the top surface of the alignment structures and spaced apart gate stacks, wherein the code programming mask is over the sacrificial gate portions of the gate stacks;

patterning and etching the code programming mask to expose portions of the plurality of sacrificial gate portions;

removing the exposed portions of the plurality of sacrificial gate portions to expose channel regions in the conductive layer; and implanting ions in the channel regions.

2. The method of forming a integrated circuit device as in claim 1 wherein the plurality of spaced apart gate stacks are formed by forming a sacrificial gate layer over the conductive layer, the sacrificial gate layer combining with the conductive layer to form a gate stack layer; and patterning and etching the gate stack layer to form the plurality of spaced apart gate stacks having openings therebetween, each of the plurality of gate stacks having a sacrificial gate portion formed from the sacrificial gate layer and a wordline formed from the conductive layer.

3. A method of forming an integrated circuit device as in claim 2 wherein the gate stack layer further includes an etch stop layer formed over the conductive layer prior to the forming of the sacrificial gate layer such that each gate stack has an etch stop between its associated wordline and sacrificial gate portion.

4. The method of forming an integrated circuit device as in claim 1 wherein the plurality of alignment structures are formed by:

depositing an ion barrier layer over the gate stacks such that the ion barrier layer fills the openings between adjacent gate stacks; and etching back the ion barrier layer to form a plurality of alignment structures, each of the plurality of alignment structures being positioned in an associated one of the openings.

5. A method of forming an integrated circuit device as in claim 4, wherein the ion barrier layer is etched away to form alignment structures having a height substantially the same as the level of the gate stacks so that the top surface defined by the alignment structures and the sacrificial gates is a substantially planar top surface.

6. A method of forming an integrated circuit device as in claim 1 wherein the plurality of alignment structures are formed of one selected from the group consisting of silicon dioxide and silicon nitride.

7. A method of forming an integrated circuit device as in claim 1 wherein the code programming mask is a photoresist layer disposed over a bottom anti-reflective coating (BARC) layer.

8. A method of forming an integrated circuit device as in claim 1 wherein each of the plurality of alignment structures has a thickness of not more than about 7000 Å, each of the plurality of wordlines has a thickness between about 3000 Å and about 3500 Å and each of the plurality of sacrificial gate portions has a thickness between about 3000 Å and about 3500 Å.

9. A method of forming an integrated circuit device as in claim 1 wherein the integrated circuit device is a read-only memory (ROM) array.

10. A method of forming an integrated circuit device as in claim 1, wherein the top surface defined by the alignment structures and the sacrificial gates is substantially planar.

11. The method, as recited in claim 3, wherein the etch stop is thin enough to allow ion implantation through the etch stop.

12. The method, as recited in claim 3, wherein the etch stop has a thickness on the order of 300 Å.

* * * * *